United States Patent [19]

Kent

[11] Patent Number: 4,513,498

[45] Date of Patent: Apr. 30, 1985

[54] METHODS AND APPARATUS FOR SIMULTANEOUSLY INSERTING AN ARRAY OF FLEXIBLE PINS INTO A WORK PIECE

[75] Inventor: William C. Kent, Garland, Tex.

[73] Assignee: AT&T Technologies, Inc., New York, N.Y.

[21] Appl. No.: 468,611

[22] Filed: Feb. 22, 1983

[51] Int. Cl.³ .................... H05K 3/00; B23P 19/04
[52] U.S. Cl. ............................ 29/845; 29/739; 227/119; 227/135
[58] Field of Search .............. 29/845, 842, 564.1, 29/739, 464; 227/107, 119, 135

[56] References Cited

U.S. PATENT DOCUMENTS

| 3,144,706 | 8/1964 | Vrsecky. |
| 3,601,890 | 8/1971 | Pityo et al. ...................... 29/874 |
| 3,765,075 | 10/1973 | Olney, Jr. et al. . |
| 3,812,569 | 5/1974 | Kufner et al. ..................... 29/464 X |
| 4,102,043 | 7/1978 | Andrade et al. . |
| 4,203,698 | 5/1980 | Dupuis ............................. 29/739 X |
| 4,265,013 | 5/1981 | Brown et al. . |

FOREIGN PATENT DOCUMENTS 462619 12/1968 Japan ........................ 29/739

*Primary Examiner*—Howard N. Goldberg
*Assistant Examiner*—Carl J. Arbes
*Attorney, Agent, or Firm*—R. P. Miller; M. de Picciotto

[57] ABSTRACT

A terminal strip 10 (see FIG. 7) is assembled by the method and apparatus so that two tiers of pins 11 are force fitted into blind holes 13 formed in a plastic strip 12. Two tiers of terminal pins are advanced by two rows of pusher rods 41 and 42 from stacks 16 of pins through holes 31 and 32 in a slide bar 28 into passageways 26 and 27 of a loader block 21 so that the leading end of the pins project from the block while the trailing ends are fully seated within the passageway. The slide block 28 is shifted to block the rear end of the passageways 26 and 27. Next, a work holder nest 51 loaded with a plastic strip 12 is moved toward the now held pins 11 to force seat the pins into the blind holes 13. The nest is withdrawn, and cleats 63, 64 and 58 pull the plastic strip 12 to withdraw the pins 11 from the passageway to permit the subsequent removal of the assembled terminal strip 10.

11 Claims, 7 Drawing Figures

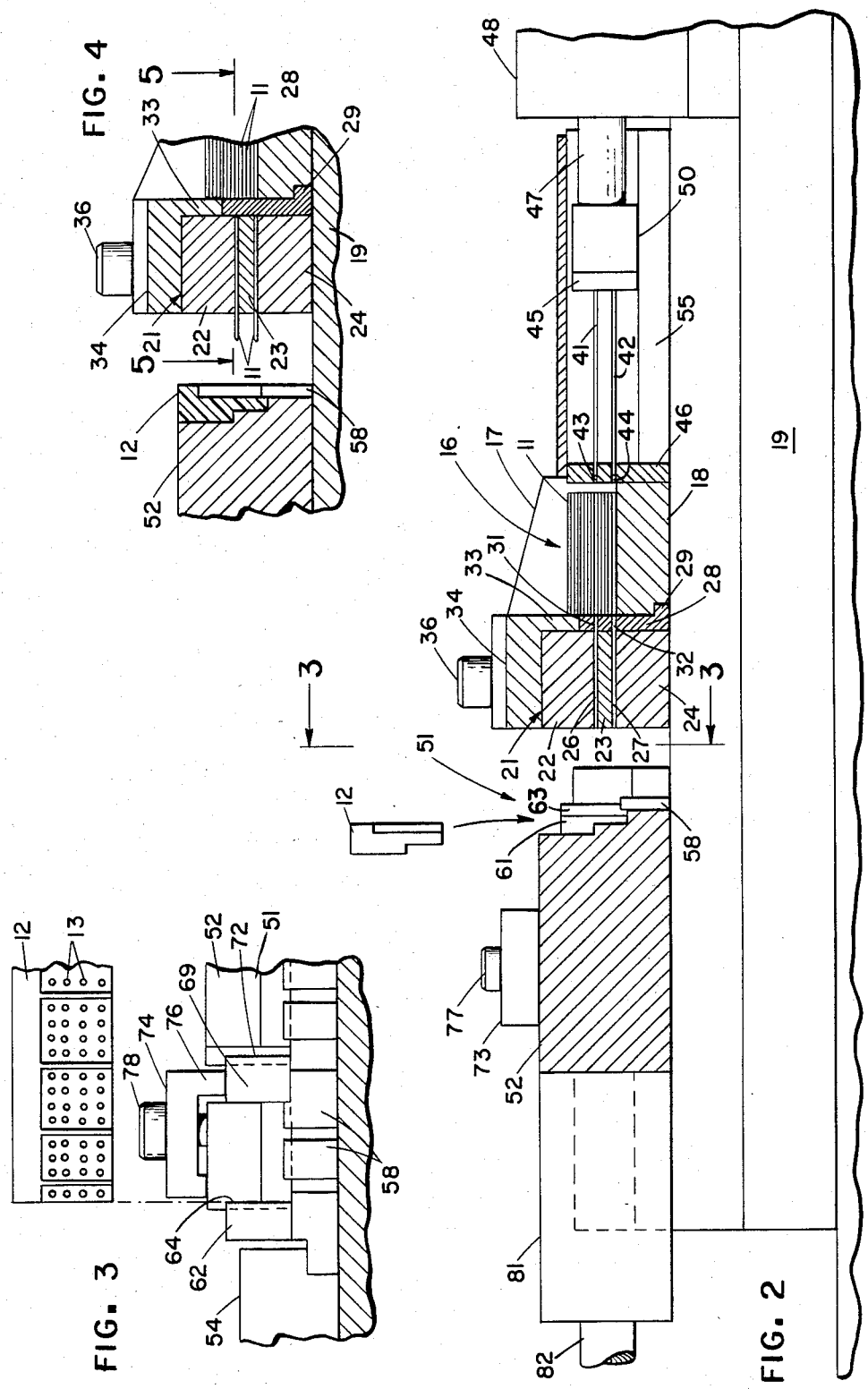

METHODS AND APPARATUS FOR SIMULTANEOUSLY INSERTING AN ARRAY OF FLEXIBLE PINS INTO A WORK PIECE

FIELD OF INVENTION

This invention relates to methods and apparatus for simultaneously inserting an array of flexible pins into a work piece such as an apertured terminal support and more particularly to methods and apparatus for immuring an array of spaced pins while an article having a like array of blind holes is positioned onto the pins to set the pins in the blind holes.

BACKGROUND OF INVENTION

In the manufacture of various information processing and telephone switching equipments, supports such as plastic strips or circuit boards with arrays of terminal pins are extensively used to provide either mountings for various electrical and semiconductor devices or terminal posts for mounting wires that interconnect electrical devices which may be mounted on the same strip or board or may be remotely mounted on separate strips or boards. In assembling the terminal pins in the supports, the pins may be mounted individually or in arrays but in either case extreme care must be exercised to avoid bending of the pins or damage to the pin supports. The pins must orthogonally project from the supports in parallel relation because subsequent use with automatic component assembly, wire wrapping and test apparatuses requires the precise positionment of the pins. These terminal pins are usually constructed of a pliable material and are dimensioned so as to be somewhat flexible and may be easily bent if stressed beyond the elastic limits of the pin materials.

The assembly of the flexible pins into holes formed in a circuit module such as printed circuit boards or connector strips presents the obvious problem of preventing bending of the pins during the insertion operation. The usual procedure is to feed the pins individually or in an arrayed mass into a chuck device with the trailing end or ends of the pins projecting from the chuck and then moving the chuck towards a circuit board with preformed holes so that the projecting end or ends of the terminals are seated within the holes. For example, there is shown in U.S. Pat. No. 4,265,013 issued May 5, 1981, to V. B. Brown et al. an apparatus for inserting pins one at a time into a circuit board. During each cycle of operation of the apparatus, a slide moves a lower pin from a magazine stack into a chuck so that the trailing extremity of the pin projects from the chuck. The chuck is thereafter moved and pivoted to align the projecting end of the pin with a hole in the printed circuit board whereafter the chuck is moved to insert the pin in the aligned hole.

In other pin inserting apparatus, such as disclosed in U.S. Pat. No. 3,765,075 issued Oct. 16, 1973, to V. D. Olney, Jr. et al., a laterally aligned cluster of pins are advanced from a plurality of bins into a head with the trailing portions of the pins being left to extend from the head. Subsequent to the loading of the pins, the head is pivoted and moved to insert the laterally aligned pins into a row of holes formed in a circuit board. The circuit board is supported on an X-Y drive system which cyclically functions in conjunction with the operation of the insertion head to position successive rows of circuit board holes to receive rows of pins.

Another type of pin insertion apparatus contemplates the insertion of a cluster of more than one row of pins into a like array of holes formed in a printed circuit board. As an example, there is shown in U.S. Pat. No. 4,102,043 issued July 25, 1978, to R. W. Andrade et al., a pin insertion apparatus which includes an apertured template which is loaded with pins and then positioned to load the pins into apertures formed in a spring supported platen of a press. A circuit board is placed with holes formed therein to overly the apertures in the platen. A further platen is provided with positioner pins that are adapted to be moved through the apertures in the spring supported platen to position the pins into the holes in the circuit board which in turn is held from movement by a further platen having bores formed therein to receive the pins positioned through the board. There are still needs for pin insertion apparatus that is of simple, rugged construction which confine the pins against distortion during insertion into a circuit module, a terminal strip or circuit board, particularly where the pins are force fitted into holes which do not extend completely through the module.

SUMMARY OF INVENTION

This invention contemplates, among other things, a method and apparatus for simultaneously assembling an array of bendable pins into an array of holes formed in a module such as a terminal strip or circuit board without deforming the pins or damaging the circuit module.

More particularly, the method and apparatus contemplates the use of a number of closely spaced bins for holding stacks of bendable terminal pins which are to be seated in an array of blind holes formed in a plastic terminal strip. The holes in the terminal strip and the terminal pins are dimensioned so that during the assembly operation the pins are force fitted into the holes. The method is accomplished by advancing two sets of parallel pushers through the stacks to pick off a first tier of lowermost pins and a second tier of pins which are spaced thereabove whereafter the two tiers of pins are advanced into and through an array of passageways formed in a loader block so that the trailing extremities of the pins are fully seated with the passageways while the forward ends of the pins are positioned to project beyond the loader block. Immediately thereafter the pushers are withdrawn and a retainer slide is positioned to block the entries to the passageways. Next a work holder having a nest to receive the terminal strip is advanced to move the blind holes over the forward projecting ends of the pins to force fit the pins in the terminal strip holes. The nest is surrounded by a series of lips so that when the work holder is restored to the initial position following insertion of the pins the lips act to pull the terminal strip and the force fitted pins from the passageways in the loader block.

With the afore-described method and apparatus, it may be appreciated that only minimum lengths of the pins that are to be inserted in the holes need be exposed during the actual insertion step. The remainder of the pins are immured within the passageways which are dimensioned to provide for the free passage of the pins during the loading of the block but which limit the flexing of the pins beyond their elastic limits during insertion of the pins into the blind holes. Even if there is a slight distortion or a slight bending of a few of the pins in the passageways, the force fitted pins are easily removed when the pulling lips around the nest engage the strip and pull the strip back with the slide during the return movement of the work holder.

DESCRIPTION OF THE DRAWING

Other features and advantages of the invention will be apparent upon consideration of the following detailed description when considered in conjunction with the drawing wherein:

FIG. 2 is a sectional view taken along line 2—2 of FIG. 1 particularly showing the construction of a loader block having an array of passageways for receiving the array of pins that are to be inserted in the terminal strip which is shown removed from the apparatus;

FIG. 3 is a sectional view taken along line 3—3 of FIG. 2 illustrating the construction of a nest for receiving a terminal strip together with pulling lips formed about the nest for moving the pin assembled strip back to an unload position;

FIG. 4 is a partial sectional view similar to sectional view FIG. 2 showing two tiers of terminal pins within the loader block and a slide positioned to confine the pins within the loader block;

DETAILED DESCRIPTION

Figure 7:
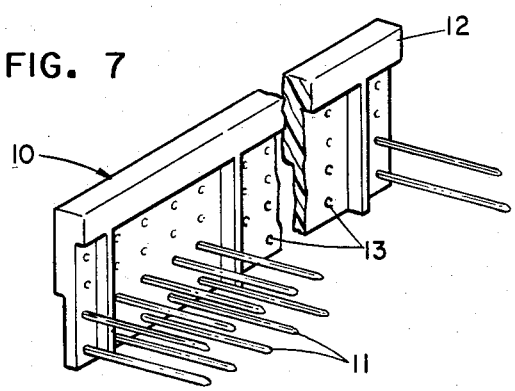
FIG. 7 is a perspective view of a completed terminal pin strip with two tiers of terminals inserted therein.

Referring to FIG. 7 there is shown one type of terminal strip 10 with projecting terminal pins 11 that may be readily assembled by the method and apparatus of the present invention. This particular terminal strip is constructed of a molded plastic strip 12 having a coordinate array of blind holes 13 into which are force fitted an array of terminal pins. The pins may be constructed of various metals such as alloys of copper or aluminum which are flexible but which may be stressed beyond elastic limits so that the pins are bent. In the assembly of such pliable pins, it is necessary that the pins be not flexed and stressed beyond elastic limits so that the assembled structure presents a coordinate array of pins orthogonally projecting in parallel relation from the base strip 12. Electrical modules, such as the disclosed terminal pin strip and other terminal pin structures such as connectors, circuit components, printed circuit boards, are subsequently processed in various types of machines, e.g., wire wrapping machines, automatic component assembly machines, automatic wiring machines and circuit test machines all of which depend for successful operation upon a terminal pin structure having straight pins.

Figure 1:
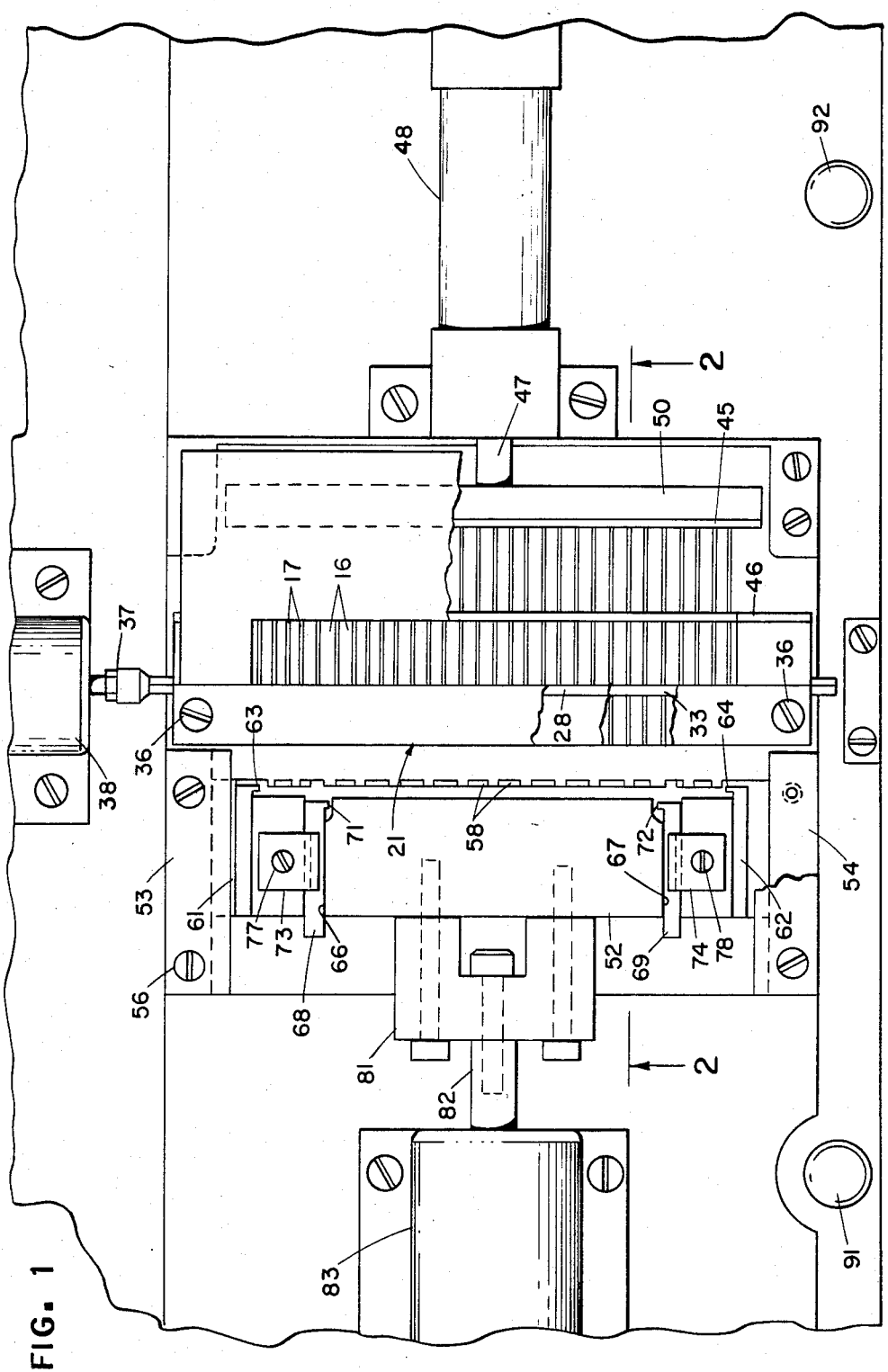
FIG. 1 is a plan view of an apparatus for inserting an array of pins into a like array of holes formed in a work piece such as a terminal strip, in accordance with the principles of the present invention.
Figure 6:
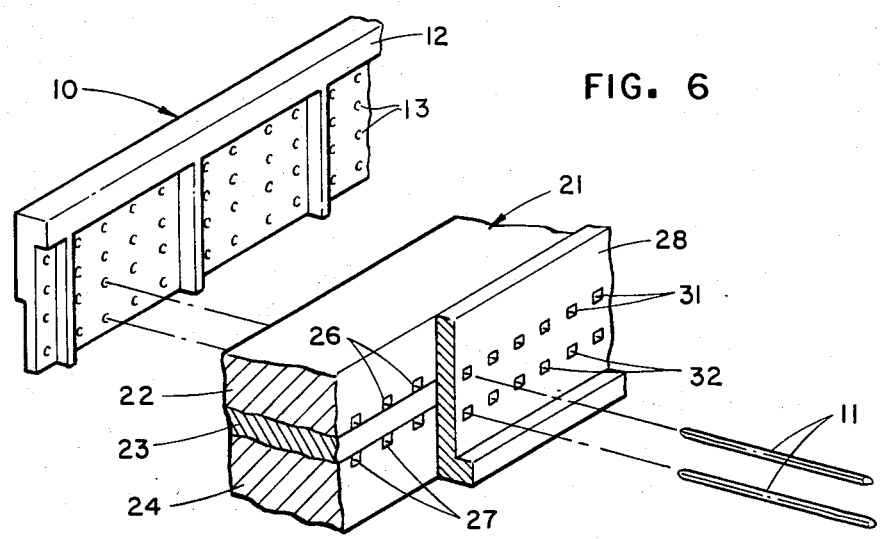
FIG. 6 is a perspective view illustrating the relationship between the terminal pins, the loader block, a pin retainer and the terminal strip at a time prior to the insertion of the pins.

Attention is directed first to FIGS. 1 and 2 where there is disclosed a plurality of bins 16 defined by divider panels 17 for holding vertical stacks of terminal pins 11. As shown in FIG. 6 the pins utilized to illustrate the present invention are constructed with a square cross configuration and have pointed forward and rearward ends. The bins 16 may be loaded by hand, from a magazining device, or from an automatic feeder such as a plurality of tracks running to one or more vibratory hoppers containing supplies of pins. The lowermost pins in the respective stacks rest on the top of a plate 18 secured to a bed 19 for supporting the overall apparatus. Positioned to the left of the plate 18 and mounted on the bed 19 is a loader block 21 made up of three sections, 22, 23 and 24. As clearly shown in FIG. 6, loader bar sections 22 and 24 are slotted to provide two tiers of passageways 26 and 27. The intermediate section 23 defines the bottoms of passageways 26 and the tops of passageways 27. Interposed between the plate 18 and the loader block 21 is a transverse slide bar or backing plate 28 having a guide foot 29 journalled within an elongated bearing slot formed in the plate 18. The bar 28 is thus slidably mounted. It is formed with two tiers of flared mouth bores 31 and 32 which are aligned with entries to the passageways 26 and 27. The top of the bar 28 slidably engages a bearing surface formed on the end of a leg 33 depending from a cross member 34 which is secured by bolts 36 to the loader block 21. The slide bar 28, as shown in FIG. 1, is coupled to a piston rod 37 emanating from an air cylinder 38. Operation of the air cylinder 38 moves piston rod 37 to shift the bar 28 so that non-bored sections of the bar are presented to block the entries to the passageways 26 and 27.

Pins 11 are advanced from the stacks 16 by a pusher arrangement comprising two tiers of pusher rods 41 and 42. The forward ends of the pusher rods 41 and 42 rest within apertures 43 and 44 formed in a guide plate 46 secured to the bed 19. Rods 41 and 42 are anchored in a blade 45 secured to a slide block 50 mounted in ways formed in a bed 55. The slide block 50 is connected to a piston rod 47 extending from an air cylinder 48. When the air cylinder 48 is operated, the rods 41 and 42 advance through the apertures 43 and 44 to engage the lowermost pin 11 in each stack and the fifth or other selected spaced pin 11 in each stack. The two spaced tiers of engaged pins are pushed from the stacks through the bores 31 and 32 into the passageways 26 and 27. The movement of the rods 41 and 42 is sufficient to seat the trailing ends of the pins fully within the passageways 26 and 27 while the forward ends of the pins project from the exit end of the passageways formed in the left face of the loader block 21 in the manner best shown in FIG. 4.

A plastic terminal strip 12 is loaded by an attending operator into a nest 51 formed in a slide block 52 mounted between inverted L-shaped guide members 53 and 54 secured by bolts 56 to the machine bed 19. The nest 51 is shaped to conform to the rear section of the terminal strip 12. Secured to the front face of the block 52 are a number of retainer lip like members 58 which engage the lower edge of the terminal strip 12. Mounted on opposite ends of the slide block 52 are a first pair of L-shaped retainers 61 and 62 having leg or cleat sections 63 and 64 projecting toward each other to engage the opposite ends of the terminal strip 12. If it is desired to insert pins into a shorter length terminal strip 12, additional end retainers may be provided. More particularly, the block 52 is formed with a pair of transverse slots 66 and 67 into which is slidably mounted a pair of L-shaped end retainers 68 and 69 having edge engaging cleats 71 and 72. As shown in FIG. 1, the retainers 68 and 69 are held in a retracted position by a pair of U-shaped clamps 73 and 74 having depending legs such as leg 76 shown in FIG. 3 which bear against the tops of the retainers. The clamps are held in position by a pair of bolts 77 and 78. If a shorter length of terminal strip is selected to receive terminal pins, one or both of the clamps 73 and 74 are released and the retainer members 68 and 69 are moved forward into the nest 51 so that either or both of the cleats 71 and 72 are positioned to grip the opposite ends of the terminal strip. The bolts 77 and/or 78 are tightened to hold the respective retainers in the extended position within the nest 51.

Secured to the rear end of the work holder block 52 is a clevis 81 which is bolted to a piston rod 82 extending from a hydraulic cylinder 83. When the cylinder 83 is operated to advance the piston rod, the work holder block 52 is moved to the right to advance the terminal strip with the blind holes 13 toward the projecting ends of the terminal pins 11 immured within the loader block 21.

Figure 5:
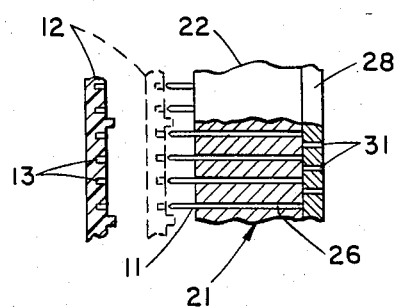
FIG. 5 is a sectional view taken along line 5—5 of FIG. 4 depicting one tier of pins in the loader block positioned in alignment with blind holes formed in the terminal strip.

In summary of the operation of the apparatus and practice of the method, the bins 16 are filled with stacks of pins 11. The slide block 52 and nest 51, as shown in FIG. 2, are spaced a considerable distance from the front face of the loader block 21 to facilitate the loading of a terminal strip 12 in the nest. The attending operator places a terminal strip 10 in the nest 51 so that the bottom and end of the strip are positioned behind the retainers 58 and the cleats 63 and 64. The overall operation of the apparatus may be controlled by a sequence circuit utilizing an interconnected circuit of limit switches or a cam controller for sequentially operating the cylinders 38, 48 and 83 or any of a large number of commercially available program controlled sequencers. The control circuit utilized includes a pair of spaced palm operated switches 91 and 92 which must be depressed by use of both of the attending operator's hands to initiate a cycle of operation of the apparatus. In a preferred embodiment of the operation, the hydraulic cylinder 83 is operated to move the terminal strip 12 toward the loader block to a position shown in dotted outline in FIG. 5 so that when the pins 11 are advanced into the passageways 26 and 27 the projecting pointed ends will be positioned within the entries of the blind holes 13 formed in the terminal strip. Next, the cylinder 48 is operated to drive rods 41 and 42 into the stacks of pins 11 to pick off the lowermost pin in each stack as well as one other vertically spaced pin. The two spaced tiers of picked off pins are advanced through the bores 31 and 32 of the backing plate 28 and on into the passageways 26 and 27. The trailing extremities of the pins are fully seated within the passageways while the forward ends are advanced to extend beyond the front face of the loader block 21 and into the entries to the blind holes 13 formed in the strip 12. The entry sections of the bores 31 and 32 and the passageways 26 and 27 may be flared to assist the entry of the pins 11.

Next, the cylinder 38 is operated to move the piston rod 37 to shift the transverse bar 28 to present non-bored sections of the bar to block the rear entries of the passageways 26 and 27. Immediately thereafter, the hydraulic cylinder 83 is further operated to move the nest 51 with the terminal strip 12 forward so that the terminal strip is pushed onto the projecting ends of the pins. The pins are configured to be slightly larger than the blind holes 13 and thus are force fitted into the blind holes. The operation of the cylinder 83 is reversed whereupon the retainers 58 and the cleats 63 and 64 act against the edges of the terminal strip to uniformly pull the terminal strip and the assembled pins toward the left. The movement of the work holder block 52 is sufficient to completely withdraw the assembled pins from the passageways 26 and 27. During the pin assembly operation the pins may be slightly bent and tend to bind within the passageway. However, during the strip withdrawal operation, the strip is engaged along its bottom and side edges so that the strip is easily pulled with sufficient uniformly distributed force to withdraw the pins from the passageways 26 and 27.

What is claimed is:

1. An apparatus for inserting a row of pins into a row of holes formed in a work piece comprising:

a loader block having a first and a second surface with a row of passageways formed therein between said surfaces, said passageways being spaced apart distances equal to the distance between the holes in the work piece and having lengths less than the lengths of the pins;

a plurality of bins located on the first surface side of the block and aligned with the row of passageways for receiving stacks of pins;

a plurality of first pusher rods located adjacent to said bins and arrayed in a row with spaced apart distances equal to the spacings between the passageways, said pusher rods being mounted in alignment with individual pins in the respective bins;

a work holder located on the second surface side of the block and having a nest for receiving the work piece and positioning the holes in the work piece in alignment with the passageways;

means coupled to the pusher rods for reciprocating them to engage and move pins from the individual stacks into the passageways;

means located between the loader block and the bins and operated upon retraction of the pusher rods for closing the entries to passageways in said loader block; and means coupled to the work holder for advancing it toward the loader block to seat the pins within the holes formed in the work piece.

2. An apparatus as defined in claim 1 wherein said closing means includes:

a transverse bar interposed between said bins and said first surface of the loader block having a plurality of bores extending therethrough which are initially positioned in alignment with the entries to said passageways; and means coupled to said transverse bar and rendered effective upon reciprocation of said pusher rod for shifting said transverse bar to present non-bored sections thereof to the entries to said passageways in said loader block.

3. An apparatus as defined in claim 1 for inserting two rows of pins into a workpiece having two rows of holes, which includes:

a second set of pusher rods spaced from the first pusher rods, and secured to move with the means for reciprocating the plurality of first pusher rods to move a second row of pins from the bins; and said loader block is formed with a second row of passageways spaced apart distances corresponding to the spacing between the holes in the second row of holes formed in the work piece for receiving the second row of pins advanced from the bins by the second set of pusher rods.

4. An apparatus as defined in claim 1, which comprises:

a pair of retainers mounted on said work holder having cleats for gripping opposite sides of a work piece positioned in said nest; and a plurality of members secured to said work holder and projecting into said nest to hold a lower edge of a work piece positioned in said nest.

5. An apparatus as defined in claim 1 wherein the work holder is provided with a plurality of slots extending into the nest, and which comprises:
   a plurality of slide members positioned in said slots, each of said slide members having a cleat for engaging a side of the work piece; and
   clamping means mounted on the work holder for locking said slide members in positions fully within said slots or in positions projecting from said slots into said nest to engage sides of a work piece positioned in said nest.

6. An apparatus for force fitting a predetermined array of two spaced tiers of terminal pins in a like array of blind holes formed in a plastic strip, which comprises:
   a fixed loader block having two tiers of passageways horizontally extending between two opposite sides thereof, said passageways being arrayed in a pattern corresponding to the array of terminal pins to be inserted in the holes formed in the plastic strip and having lengths which are less than the lengths of the terminal pins;
   a slide mounted on one side of said block with a two tiered array of bores corresponding to and overlying the passageways formed in said block;
   a pusher member located adjacent to the opposite side of said block and having a nest for receiving the plastic strip and positioning the two tiers of blind holes in alignment with said two tiers of passageways formed in said block;
   means located adjacent to said slide for holding a plurality of stacks of terminal pins, each of said stacks having a lowermost pin aligned with a first tier bore in said slide and a first tier passageway in said block, and a second spaced pin aligned with a second tier bore in said slide and a second tier passageway in said block;
   a horizontal series of inserter pins arrayed in two tiers having forward ends of the first tier aligned with the lowermost terminal pins in said stacks and forward ends of the second tier aligned with a spaced second tier of terminal pins;
   means for moving said two tiers of inserter pins relative to said loader block and said means for holding to pick off the lowermost terminal pins and the second spaced terminal pins from said stacks and moving the two tiers of terminal pins through said bores and said passageways to deposit said terminal pins in said passageways with the trailing extremities fully within said passageways and the forward extremities projecting from said passageways;
   means coupled to the slide for shifting said slide relative to said loader block to move non-bored sections thereof to overlay said passageways; and
   means for moving said pusher member toward said loader block to insert the projecting forward extremities of the terminal pins into the blind holes formed in said plastic strip while pushing said trailing extremities of said terminal pins against said slide.

7. An apparatus as defined in claim 6 wherein said pusher member is initially operated to position said strip and the blind holes formed therein to receive the tips of said terminal pins upon said inserter pins depositing said terminal pins in said passageways, whereafter said pusher member is moved toward said loader block following operation of said shifting means to seat said terminal pins in the blind holes while said terminal pins are blocked from movement by the non-bored sections of said slide.

8. A method of seating an array of spaced pins into a like array of holes formed in an article, which comprises:
   supporting supplies of pins in stacks corresponding to the spacing of the holes in the article and with the lowermost pin of each stack aligned with a hole formed in the article;
   picking off the lowermost pin in each stack and axially advancing the pins into an array of passageways corresponding to the array of holes formed in the article, said advancing step being sufficient to position the trailing extremities of the pins within said passageways and the forward extremities of the pins projecting from the passageways;
   blocking the passageways to prevent the trailing extremities of the pins from being pushed from the passageways; and
   advancing the article to move said holes onto the projecting forward extremities of said pins while said pins are blocked from movement from said passageways.

9. A method as defined in claim 8 wherein said article is formed with a second array of holes, and which comprises:
   picking off a second array of pins from the stacks and axially advancing the picked off pins into a second array of passageways corresponding to the second array of holes formed in the article to position said second array of pins in said second passageways with trailing extremities of the second pins being positioned within the passageways and with the foreward extremities of the second pins projecting from the passageways; and
   blocking the second passageways to prevent the trailing extremities of the second pins from being pushed from the passageways.

10. A method as defined in claim 9 wherein the pins of the second array of pins picked off and advanced from the stacks are in a tier spaced from the lowermost pins in the respective stacks.

11. A method as defined in claim 8 wherein the article is initially moved to position the holes to receive the foreward extremities of the pins advanced into said passageways.

* * * * *